United States Patent
Sukegawa et al.

(10) Patent No.: US 9,905,284 B2
(45) Date of Patent: Feb. 27, 2018

(54) DATA READING PROCEDURE BASED ON VOLTAGE VALUES OF POWER SUPPLIED TO MEMORY CELLS

(71) Applicant: TOSHIBA MEMORY CORPORATION, Tokyo (JP)

(72) Inventors: Hiroshi Sukegawa, Nerima Tokyo (JP); Yoshihiro Ueda, Yokohama Kanagawa (JP); Kenichiro Yoshii, Bunkyo Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/384,258

(22) Filed: Dec. 19, 2016

(65) Prior Publication Data

US 2017/0263301 A1    Sep. 14, 2017

Related U.S. Application Data

(60) Provisional application No. 62/305,935, filed on Mar. 9, 2016.

(51) Int. Cl.
  *G11C 7/00*    (2006.01)
  *G11C 11/16*   (2006.01)
  *G06F 1/26*    (2006.01)
  *G06F 1/28*    (2006.01)

(52) U.S. Cl.
  CPC .......... *G11C 11/1697* (2013.01); *G06F 1/263* (2013.01); *G06F 1/28* (2013.01); *G11C 11/1673* (2013.01); *G11C 11/1675* (2013.01)

(58) Field of Classification Search
  CPC .................................................. G11C 11/1697
  USPC .................................................. 365/158, 226
  See application file for complete search history.

(56) References Cited

U.S. PATENT DOCUMENTS

| | | | | |
|---|---|---|---|---|
| 5,596,758 A | * | 1/1997 | Yatsuzuka | G11C 5/141 365/226 |
| 9,058,554 B2 | | 6/2015 | Kervinen et al. | |
| 2003/0223271 A1 | * | 12/2003 | Byeon | G11C 5/147 365/185.18 |
| 2007/0263461 A1 | * | 11/2007 | Choi | G11C 7/24 365/196 |
| 2011/0149627 A1 | * | 6/2011 | Kang | G11C 5/143 365/49.1 |

FOREIGN PATENT DOCUMENTS

| | | |
|---|---|---|
| JP | 2002042479 A | 2/2002 |
| JP | 2011224923 A | 11/2011 |
| JP | 2013182505 A | 9/2013 |

\* cited by examiner

*Primary Examiner* — Hoai V Ho
(74) *Attorney, Agent, or Firm* — Patterson & Sheridan, LLP

(57) ABSTRACT

A storage device includes a memory cell array, a voltage detector disposed to detect a voltage of power supplied to the memory cell array, and a controller. The controller is configured to carry out reading of data from a target memory cell and then rewriting of the data in the target memory cell, if the detected voltage is above a threshold when a prompt of a read operation with respect to the target memory cell occurs, and prohibit the reading operation from being started, if the detected voltage is below the threshold when the prompt occurs.

18 Claims, 15 Drawing Sheets

DATA READING PROCEDURE BASED ON VOLTAGE VALUES OF POWER SUPPLIED TO MEMORY CELLS

CROSS-REFERENCE TO RELATED APPLICATIONS

This application is based upon and claims the benefit of priority from U.S. Provisional Patent Application No. 62/305,935, filed on Mar. 9, 2016, the entire contents of which are incorporated herein by reference.

FIELD

Embodiments described below relate to a memory system and a memory device.

BACKGROUND

In a memory device, when data stored in a memory cell is read out, the data may need to be written again because the data may be destroyed during the reading.

DETAILED DESCRIPTION

A storage device includes a memory cell array, a voltage detector disposed to detect a voltage of power supplied to the memory cell array, and a controller. The controller is configured to carry out reading of data from a target memory cell and then rewriting of the data in the target memory cell, if the detected voltage is above a threshold when a prompt of a read operation with respect to the target memory cell occurs, and prohibit the reading operation from being started, if the detected voltage is below the threshold when the prompt occurs.

A memory system and a memory device of embodiments are described below with reference to the drawings.

First Embodiment

Figure 1:
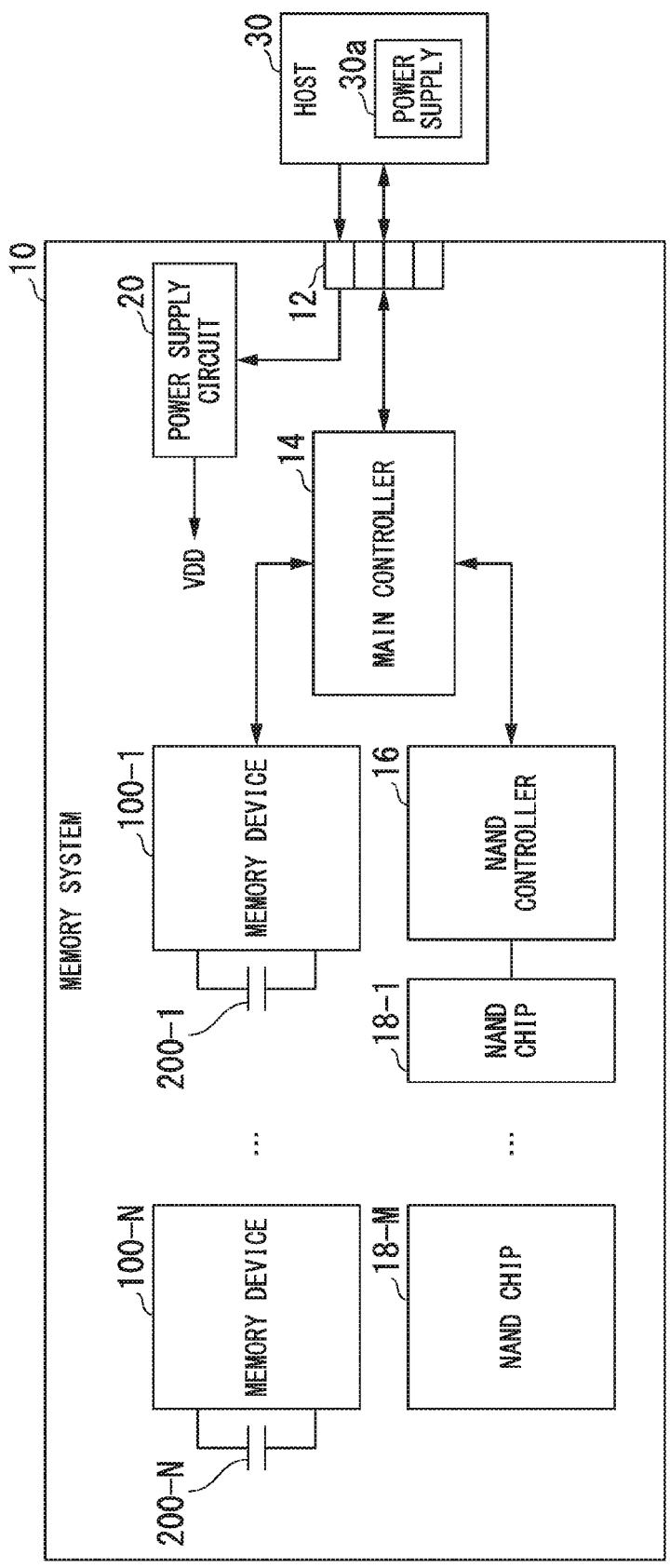
FIG. 1 is a block diagram of a memory system according to a first embodiment.

FIG. 1 is a block diagram of a memory system according to a first embodiment. A host 30 is connected to a memory system 10.

Although a power supply circuit 20 is a power converter of the memory system 10, the power supply circuit 20 is not restricted thereto. The power supply circuit 20 is connected to each component of the memory system 10 via a power supply cable (not shown). The power supply circuit 20 has the function of supplying power for operating the memory system 10.

The host 30 is an information processing device such as a personal computer or a sever device. To read data that had been written into the memory system 10, the host 30 transmits a read request to the memory system 10. When data corresponding to the read request are transmitted by the memory system 10, the host 30 receives the data. To write data into the memory system 10, the host 30 transmits a write request and the data to the memory system 10. To erase data from the memory system 10, the host 30 transmits an erase request to the memory system 10.

The host 30 has an internal power supply circuit 30a. The power supply circuit 30a may be a power converter that converts an arbitrary voltage to an output voltage supplied to the memory system 10, but is not restricted to the power converter. It is sufficient that the power supply circuit 30a have a function of converting to a voltage and supplying the converted voltage to the memory system 10. The power supply circuit 30a supplies power (first power, main power) to the memory system 10 via a cable connected to the memory system 10.

The memory system 10 is an SSD (solid-state drive), but is not restricted thereto. It is sufficient that the memory system 10 has a memory device, which will be described below. The memory system 10 may have a host interface 12, a main controller 14, a NAND controller 1b, a plurality of NAND chips 18-1, . . . , 18-M, a power supply circuit 20, a plurality of memory devices 100-1, . . . , 100-N, and a plurality of capacitors 200-1, . . . , 200-N, but is not restricted to these elements. In the above, N and M are arbitrary natural numbers. In the description to follow, unless a distinction is made among NAND chips, the notation "NAND chip 18" will be representatively used. In the description to follow, unless a distinction is made among memory devices, the notation "memory device 100" will be representatively used. In the description to follow, unless a distinction is made among capacitors, the notation "capacitor 200" will be representatively used.

Although the plurality of memory devices 100 and the plurality of capacitors 200 are included in the memory system 10, only one memory device 100 and one capacitor 200 may be provided.

The memory system 10 has a board (not shown) on which the host interface 12, the main controller 14, the NAND controller 16, the NAND chips 18, the power supply circuit 20, the memory devices 100, and the capacitors 200 are mounted. The board may be a single-layer board or a multi-layer board. The host interface 12, the main controller 14, the NAND controller 16, the NAND chips 18, the power supply circuit 20, the memory devices 100, and the capacitors 200 are each connected to power and signal lines formed on the board.

Each capacitor 200 is provided in correspondence one of the memory devices 100. That is, each capacitor 200 is not connected to memory devices 100 other than the memory device 100 corresponding thereto. The capacitor 200 is not connected to an external power source from which power is supplied to the power supply circuit 20. The external power source may include the power supply circuit 30a of the host 30, but is not restricted thereto. The external power source may include the power supply circuit 30a of the host 30 and a power line that connects the host 30 and the memory system 10, the host interface 12 and a power line that connects the host interface 12 and the power supply circuit 20, and a power line that connects the power supply circuit 20 and the memory chip 100. The "not connected to the external power source" may include a state of not being connected to a power line that connects the power supply circuit 20 and a component within the memory system 10. According to this configuration, each capacitor 200 supplies a dedicated second power (auxiliary power) with respect to the memory device 100 corresponding thereto. Also, each capacitor 200 is provided in correspondence to one memory device 100 in the present embodiment, but not limited thereto. For example, a single capacitor 200 may be connected to a plurality of memory devices 100.

The host interface 12 is, for example, an interface such as an SATA (Serial Advanced Technology Attachment) interface or an SAS (Serial Attached SCSI (Small Computer System Interface) interface. The host interface 12 receives write requests, read requests, and erase requests transmitted from the host 30. The host interface 12 transmits a received request to the main controller 14.

The main controller 14 is implemented by a processor such as a CPU (central processing unit) executing a program stored in a program memory (not shown). Alternatively, the main controller 14 may be implemented by hardware such as an LSI (large-scale integration) device, an ASIC (application-specific integrated circuit), or an FPGA (field-programmable gate array). The main controller 14, based on a request received via the host interface 12, outputs a command to the memory device 100 and the NAND chips 18.

The main controller 14 uses the memory device 100 as a main memory. The main controller 14, in response to a write request transmitted from the host interface 12, outputs to the memory device 100 a write command to write write data, which are to be stored in the NAND chip 18 later. By doing this, the main controller 14 writes the write data into the memory device 100. The main controller 14 outputs to the memory device 100 a read command to reads out, from the memory device 100, write data that had been written into the memory device 100. The main controller 14 writes into the NAND chip 18, using the NAND controller 16, the data that were read out from the memory device 100.

The main controller 14, in response to a read request from the host interface 12, outputs to the memory device 100 a write command to write data read out from the NAND chip 18. By doing this, the main controller 14 writes the read data into the memory device 100. To transmit the read data to the host interface 12, the main controller 14 outputs a read command to the memory device 100. The main controller 14 outputs to the host interface 12 data read out from the memory device 100.

The main controller 14 not only receives requests from the host 30, but also generates requests internally on its own determination. When executing processing to manage physical blocks in the NAND chip 18, the main controller 14 causes the NAND chip 18 to carry out a read operation and a write operation. In this case, the main controller 14 writes into the memory device 100 data that was read out from the NAND chip 18. Also, the main controller 14 reads out from the memory device 100 data to be written into the NAND chip 18. Although the processing to manage physical blocks in the NAND chip 18 may include processing to form free blocks in the NAND chip 18, refreshing, and garbage collection, the processing is not limited thereto. That is, the processing may be any processing to manage physical blocks.

The NAND controller 16 may include a NAND interface circuit that performs interfacing processing for the NAND chip 18, an error correction circuit, or a DMA (direct memory access) controller or the like, but not limited thereto. The NAND controller 16, based on write commands and read commands input from the main controller 14, causes the NAND chip 18 to execute write processing and read processing.

The NAND chip 18 is a memory device into which a NAND memory cell array is enclosed. A NAND chip 18 executes writing of data and reading of data, in accordance with write commands and read commands input from the NAND controller 16, respectively.

The power supply circuit 20 is connected, via the host interface 12, to the power supply circuit 30a of the host 30. The power supply circuit 20 is supplied with the first power from the power supply circuit 30a. The power supply circuit 20 converts the voltage of the first power to an operating voltage VDD of the memory device 100. The power supply circuit 20 supplies the operating voltage VDD to each memory device 100.

Although the power source (second power source) of the memory system 10 may be the power supply circuit 20, the power source is not limited thereto. The power source may be a battery mounted in the memory system 10 and a power supply circuit that supplies operating voltage to the overall memory system 10 from the battery.

Figure 2:
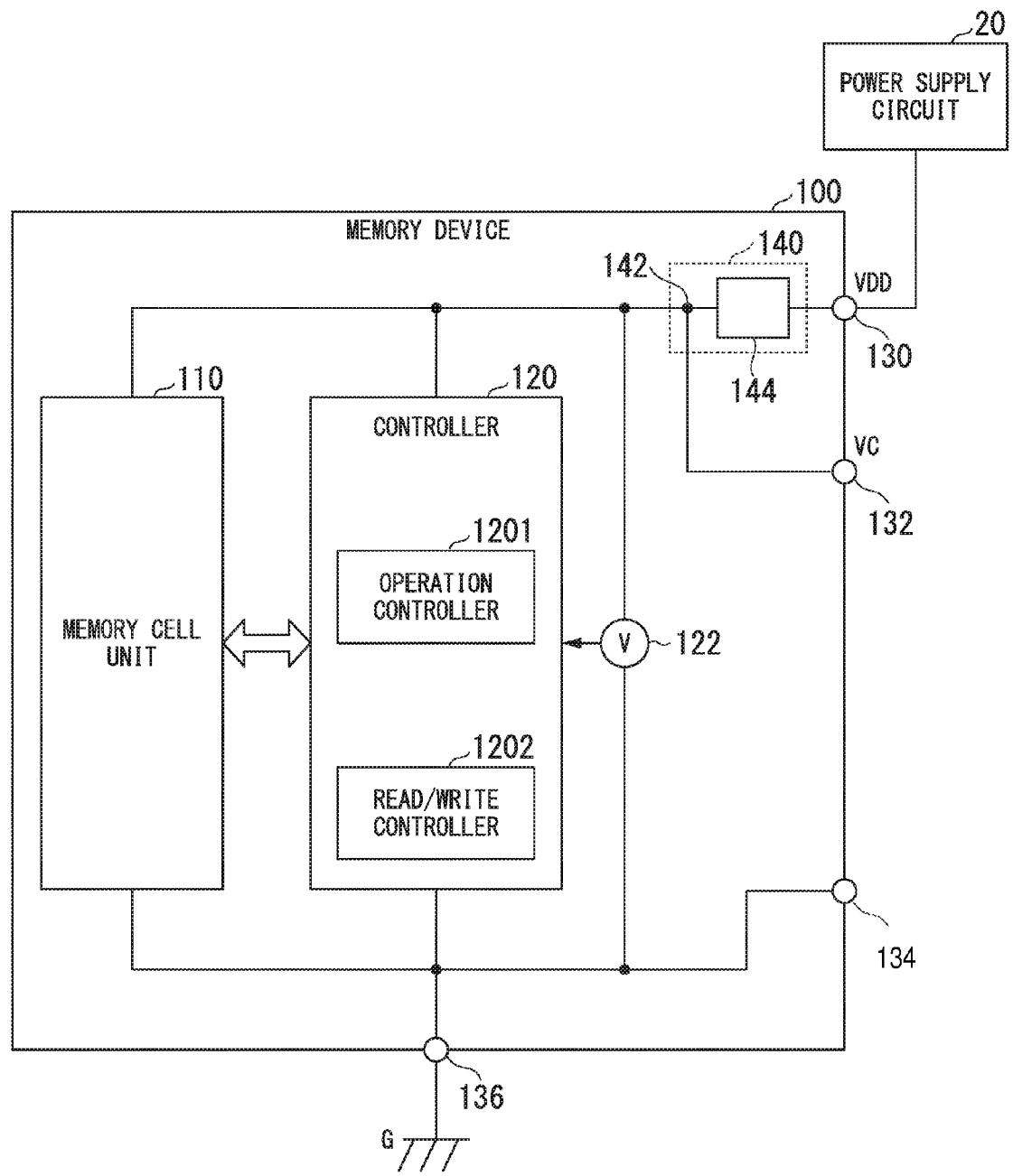
FIG. 2 is a circuit diagram of a memory device in the memory system.

The memory device 100 is a chip in which a non-volatile memory is enclosed. The memory device 100 of the present embodiment is, for example, an MRAM (magnetoresistive random-access memory). The memory device 100 of the present embodiment will be described with reference to FIG. 2. FIG. 2 is a block diagram of the memory device 100. The memory device 100 in FIG. 2 includes a memory cell unit 110, a controller 120, a voltage detector 122, a first terminal 130, second terminals 132 and 134, a ground terminal 136, and a connector 140, but is not restricted to these elements.

The memory cell unit 110 includes a plurality of memory cells. A memory cell is the smallest unit of data writing therein. Operational states of each memory cell of the memory cell unit 110 are switched by the controller 120 between a first state and a second state that is different from the first state. The first state is, for example, a state in which data "1" is written, and the second state is, for example, a state in which data "0" is written.

The controller 120 may include an operation controller 1201 and a read/write controller 1202, but not restricted to these elements. The operation controller 1201 and the read/write controller 1202 are implemented by a processor such as a CPU executing a program stored in a program memory (not shown). Alternatively, the operation controller 1201 and the read/write controller 1202 may be implemented by hardware such as an LSI device, an ASIC, or a FPGA.

The operation controller 1201 controls start of a data reading operation by the read/write controller 1202. If the voltage detected by the voltage detector 122 has dropped, the operation controller 1201 prohibits the start of the data readout operation (first processing) by the read/write controller 1202.

The read/write controller 1202 is supplied with write commands, read commands, and erase commands from the main controller 14. The read/write controller 1202, in accordance with commands received from the main controller 14, drives the memory cell unit 110. The read/write controller 1202 controls the writing and the readout of data of the memory cell unit 110.

The read/write controller 1202 performs a data readout operation of reading out data from a first cell selected from a plurality of cells (hereinafter referred to as the selected memory cell). The data readout operation includes first read processing of reading out first data from the selected memory cell, first write processing of writing reference data into the selected memory cell, second read processing of reading out the reference data that was stored in the selected memory cell, and second write processing of writing into the selected memory cell data that are the same as the first data that were read out from the selected memory cell by the first read processing, based on the relationship between the first data and the reference data.

The voltage detector 122 detects the voltage of the power supplied via the power supply circuit 20 (detector).

The first terminal 130 is connected to the power supply circuit 20. The first terminal 130 is supplied with power from the power supply circuit 20. The first terminal 130 supplies to the memory cell unit 110 and the controller 120 power supplied from the power supply circuit 20.

The second terminals 132 and 134 can be connected to a capacitor 200 provided outside the memory device 100, via an interconnect 202 (refer to FIG. 10) formed on the board of the memory system 10. One end of the capacitor 200 can be connected to the second terminal 132, which is a positive electrode terminal. The other end of the capacitor 200 can be connected to the second terminal 134, which is a negative electrode terminal. Power from the capacitor 200 is supplied through the second terminals 132 and 134. The second terminals 132 and 134 are used to supply to the memory cell unit 110 and the controller 120 the power from the capacitor 200.

The connector 140 is connected between the first terminal 130 and each of the memory cell unit 110, the controller 120, and the second terminals 132 and 134. The connector 140 may include a brancher 142 and a circuit 144. The brancher 142 is connected to the first terminal 130 via the circuit 144. The brancher 142 is also connected to the second terminal 132, the memory cell unit 110, and the controller 120. The brancher 142 supplies to the memory cell unit 110 and the controller 120 power supplied from the first terminal 130. The circuit 144 adjusts current flowing from the second terminal 132 to the first terminal 130.

Figure 3:
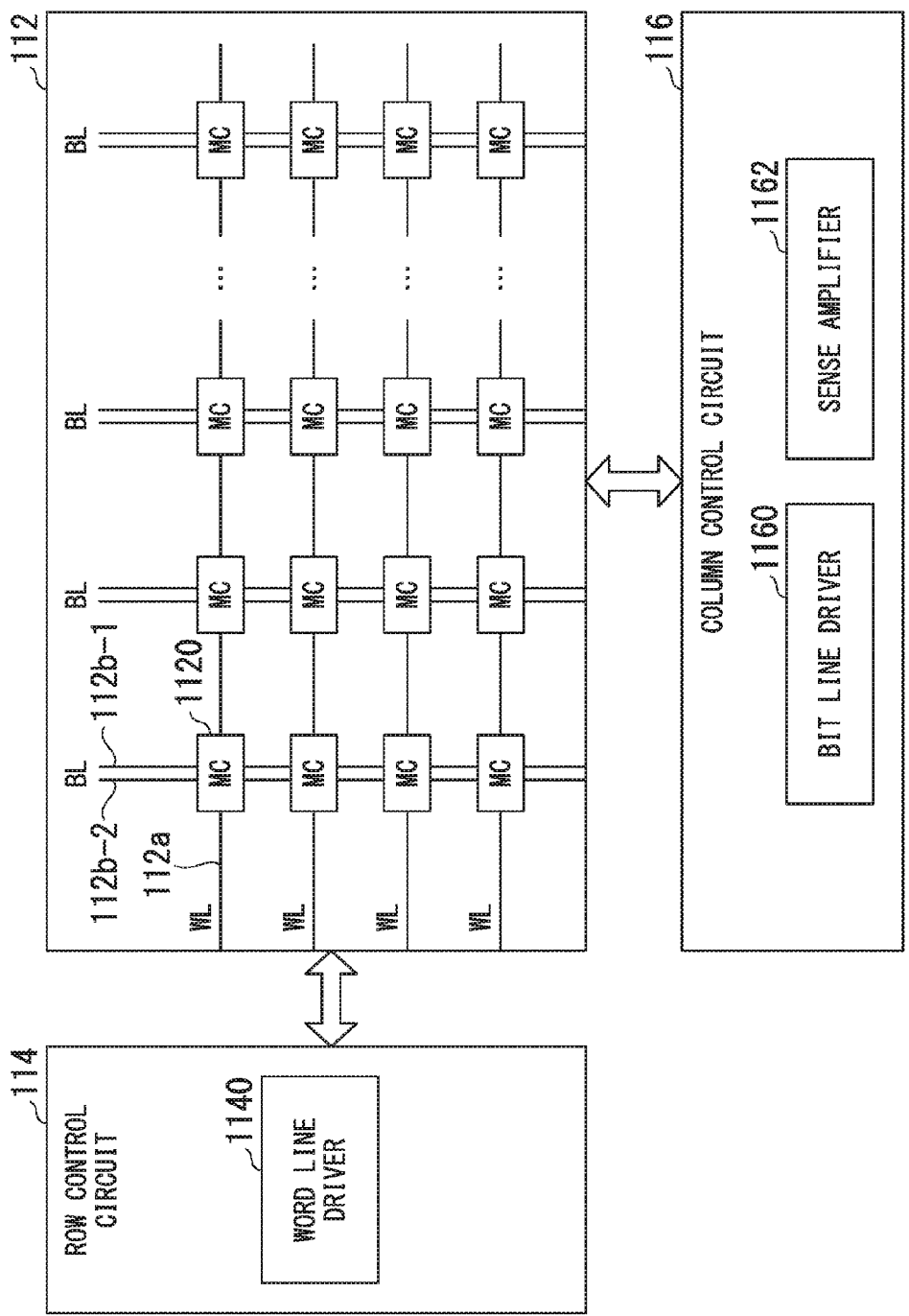
FIG. 3 schematically illustrates a memory cell unit in the memory device.

FIG. 3 shows an example of the memory cell unit 110. The memory cell unit 110 may include a memory cell array 112, a row control circuit 114, and a column control circuit 116. The memory cell array 112, the row control circuit 114, and the column control circuit 116 are mutually connected via signal lines. The memory cell array 112 shown in FIG. 3 represents a single physical block. The memory cell unit 110 has a plurality of physical blocks.

The memory cell array 112 includes a memory cell 1120, a plurality of word lines (WL) 112*a*, a plurality of bit line pairs 112*b* of bit lines 112*b*-1 and 112*b*-2. Each of the plurality of word lines 112*a* is connected to the row control circuit 114. A prescribed potential is applied to the word lines 112*a* at a timing controlled by the row control circuit 114. Each of the plurality of bit line pairs 112*b* is connected to the column control circuit 116. A prescribed potential is applied between the bit line 112*b*-1 and the bit line 112*b*-2 of each bit line pair 112*b*, at a timing controlled by the column control circuit 116.

Figure 4:
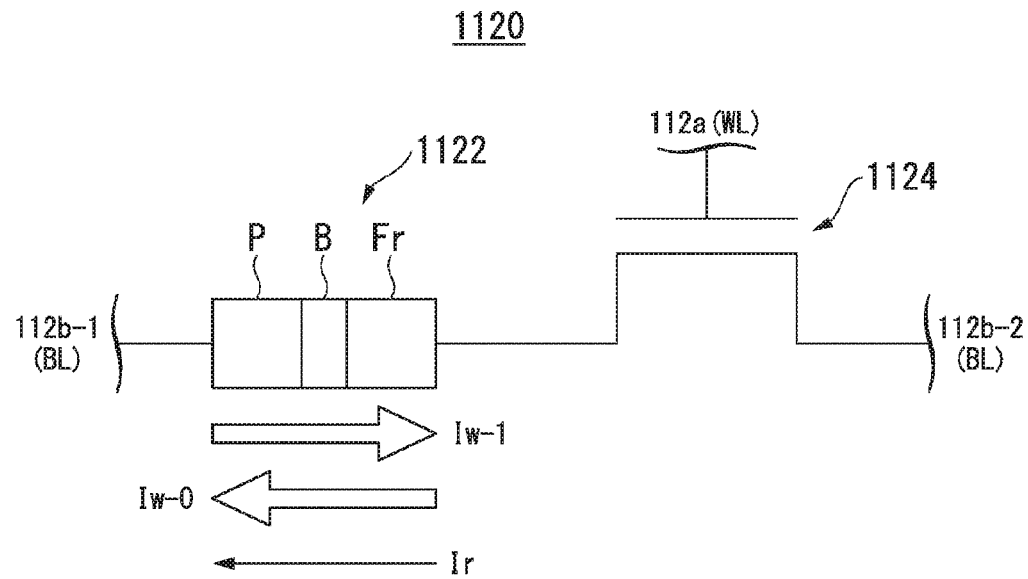
FIG. 4 schematically illustrates a memory cell in the memory cell.

FIG. 4 shows an example of the memory cell 1120. The memory cell 1120 includes a magnetic tunnel junction (MTJ) 1122 and a transistor 1124. The magnetic tunnel junction 1122 and the transistor 1124 are connected in series between the bit line 112*b*-1 and the bit line 112*b*-2 of a bit line pair 112*b*. In the memory cell 1120, the transistor 1124 is disposed on the bit line 112*b*-2 side, and the magnetic tunnel junction 1122 is disposed on the bit line 112*b*-1 side. The gate terminal of the transistor 1124 is connected to the word line 112*a*. The drain terminal of the transistor 1124 is connected to the magnetic tunnel junction 1122. The source terminal of the transistor 1124 is connected to the bit line 112*b*-2.

The magnetic tunnel junction 1122 is an element that uses a TMR (tunneling magnetoresistive) effect. The magnetic tunnel junction 1122 has a laminated structure including two ferromagnetic layers and a non-magnetic layer (insulating thin film) sandwiched therebetween. Although the magnetic tunnel junction 1122 may be formed, as shown in FIG. 4, by lamination of a fixed layer P, a tunnel barrier layer B, and a recording layer Fr, in this sequence, the order of the layers is not restricted. The fixed layer P and the recording layer Fr are ferromagnetic bodies. The tunnel barrier layer B is an insulator. The fixed layer P is a layer in which the direction of magnetization is fixed. The recording layer Fr is a layer having a variable magnetization direction.

The magnetic tunnel junction 1122, depending on the combination of the magnetization directions of the fixed layer P and the recording layer Fr, can be in either a low-resistance state or a high-resistance state. For example, if the low-resistance state is defined as the data "0" and the high-resistance state is defined as the data "1", the magnetic tunnel junction 1122 can record one bit of data. Alternatively, the low-resistance state may be defined as the data "1" and the high-resistance state may be defined as the data "0".

If a write current Iw-1 of a reversal threshold current flows in a direction from the fixed layer P to the recording layer Fr, the magnetization direction of the recording layer Fr with respect to the magnetization direction of the fixed layer P turns into an antiparallel state in the magnetic tunnel junction 1122. This causes the magnetic tunnel junction 1122 to turn into the high-resistance state (data "1"). If a write current Iw-0 of a reversal threshold current flows in a direction from the recording layer Fr to the fixed layer P, the magnetization directions of the fixed layer P and the recording layer Fr turn into the parallel state in the magnetic tunnel junction 1122. This causes the magnetic tunnel junction 112 to turn into the low-resistance state (data "0"). In this manner, the magnetic tunnel junction 1122 can write different data, depending upon the direction of write current Iw.

The magnetization direction of the magnetic tunnel junction 1122 does not reverse if a current smaller than the reversal threshold current flows. Because of this, when reading out data that had been written into the magnetic tunnel junction 1122, a read current Ir that is smaller than the write current Iw is supplied.

The row control circuit 114 includes the word line driver 1140, but not restricted thereto. That is, it is sufficient that the row control circuit 114 is configured to apply a voltage to the word line. The word line driver 1140 is connected to the plurality of word lines 112a. The word line driver 1140 controls the potential on each of the word lines 112a, based on a control signal supplied from the read/write controller 1202.

The column control circuit 116 includes a bit line driver 1160 and a sense amplifier 1162 in the present embodiment, but not limited thereto. It is sufficient that the column control circuit 116 has functions of applying a voltage to the bit line and detecting data. The bit line driver 1160 is connected to a plurality of bit lines 112b-1 and 112b-2. The bit line driver 1160 controls the potential of each of the bit lines 112b-1 and 112b-2, based on a control signal supplied from the read/write controller 1202.

The column control circuit 116 supplies either the write current Iw or the read current Ir to a memory cell selected from among the plurality of memory cells 1120 by the row control circuit 114.

Figure 5:
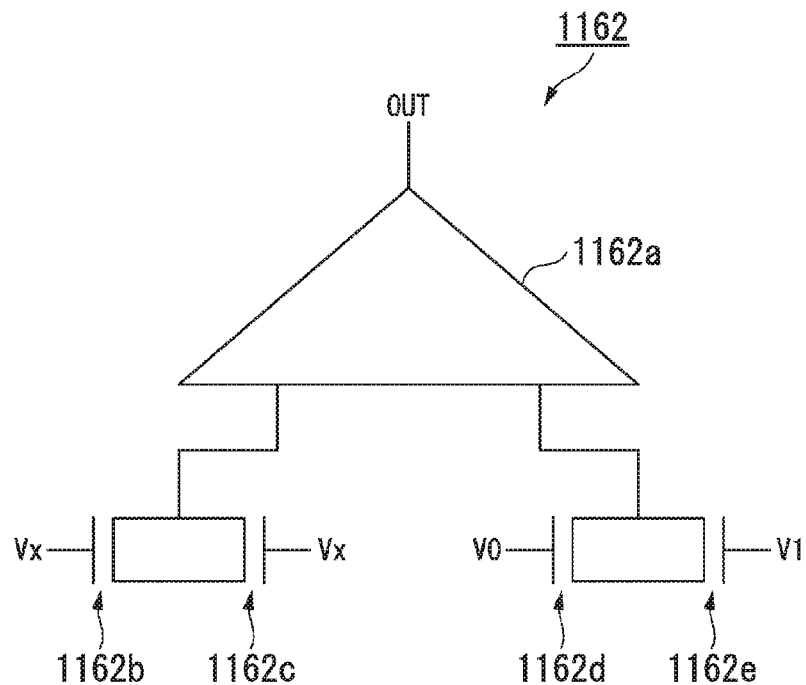
FIG. 5 illustrates a sense amplifier in the memory cell unit.

The sense amplifier 1162 senses the voltage applied to the magnetic tunnel junction 1122. The sense amplifier 1162 amplifies the signal representing the sensed voltage and determines the value of the data stored in the magnetic tunnel junction 1122. FIG. 5 shows an example of the sense amplifier 1162. The sense amplifier 1162 in the present embodiment includes a latch circuit 1162a and transistors 1162b, 1162c, 1162d, and 1162e, but not limited thereto.

The latch circuit 1162a receives a first signal corresponding to a voltage held by the transistors 1162b and 1162c and a second signal corresponding to an intermediate value of a voltage held by the transistors 1162d and 1162e. If the first signal is larger than the second signal, the latch circuit 1162a outputs to the read/write controller 1202 data "1" as a logical value. If the first signal is smaller than the second signal, the latch circuit 1162a outputs to the read/write controller 1202 data "0" as the logical value.

If the read current Ir is supplied to the selected memory cell, a voltage Vx, corresponding to the data recorded in the selected memory cell is applied to gates of the transistors 1162b and 1162c. The gates of the transistors 1162b and 1162c hold the voltage Vx as the detected voltage.

If the data "0" is recorded in the selected memory cell, a voltage V0 of the read current Ir flowing to the selected memory cell is applied to the transistor 1162d. The gate of the transistor 1162d holds the voltage V0 as the reference voltage. If the data "1" is recorded in the selected memory cell, a voltage V1 of the read current Ir flowing to the selected memory cell is applied to the transistor 1162e. The gate of the transistor 1162e holds the voltage V1 as the reference voltage.

Figure 6A:
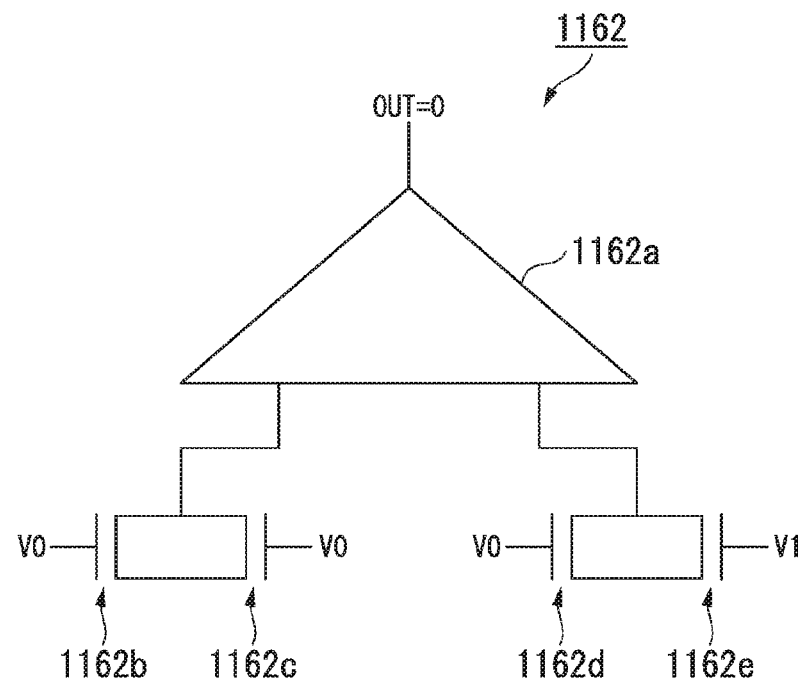
FIG. 6A shows an example of outputting data "0" from a latch circuit of the sense amplifier.

FIG. 6A shows an example of outputting the data "0" in a latch circuit. As shown in FIG. 6A, if the data "0" is recorded in the selected memory cell as the detected value, the voltage V0 is supplied to the gates of the transistors 1162b and 116c. The voltages V0 and V1 are supplied to the gates of the transistors 1162d and 116e as the reference voltages.

Figure 6B:
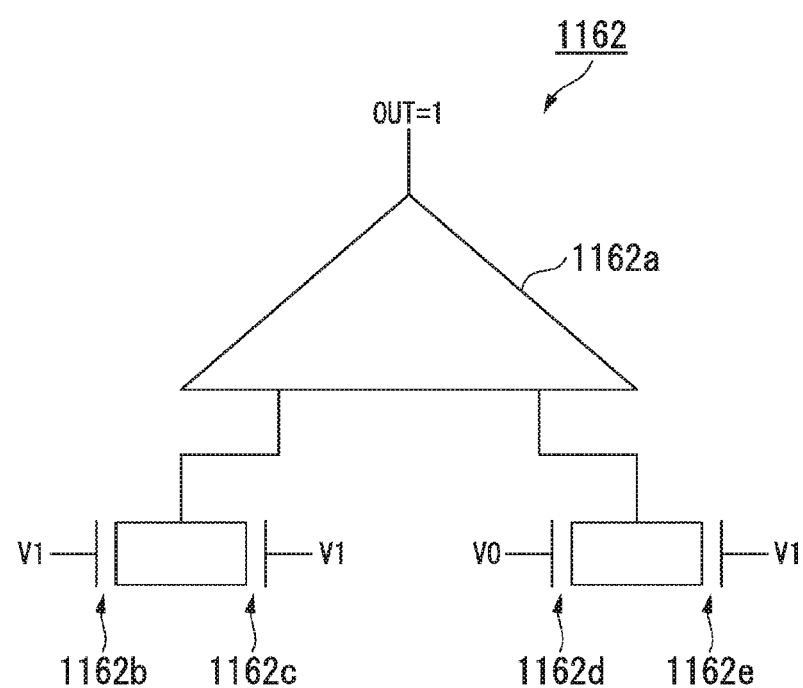
FIG. 6B shows an example of outputting data "1" from the latch circuit.

FIG. 6B shows an example of outputting the data "1" in a latch circuit. As shown in FIG. 6B, if the data "1" is recorded in the selected memory cell as the detected value, the voltage V1 is supplied to the gates of the transistors 1162b and 116c. The voltages V0 and V1 are supplied to the gates of the transistors 1162d and 1162e as the reference voltages.

The following will describe an example of a data readout operation that includes the read processing of reading out the first data from the first cell (selected memory cell) of the plurality of memory cells 1120 and the write processing of writing, into the selected memory cell, the first data that have been read out from the selected memory cell through the read processing.

Figure 7:
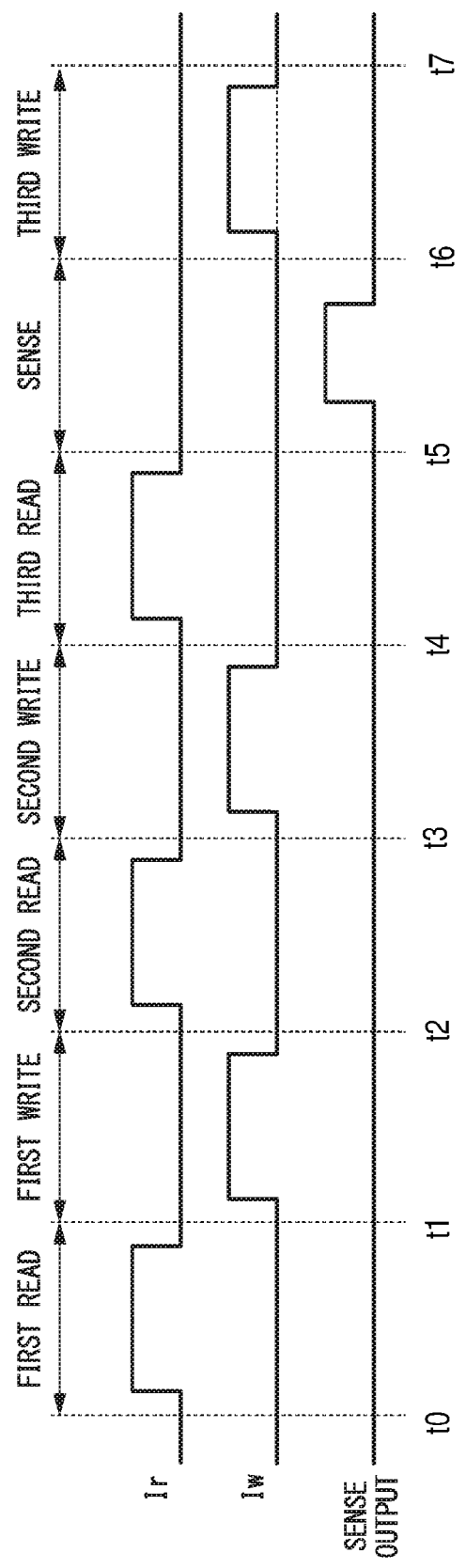
FIG. 7 is a timing chart showing levels of a read current and a write current, and ant output level of the sense amplifier during a data readout operation.
Figure 8:
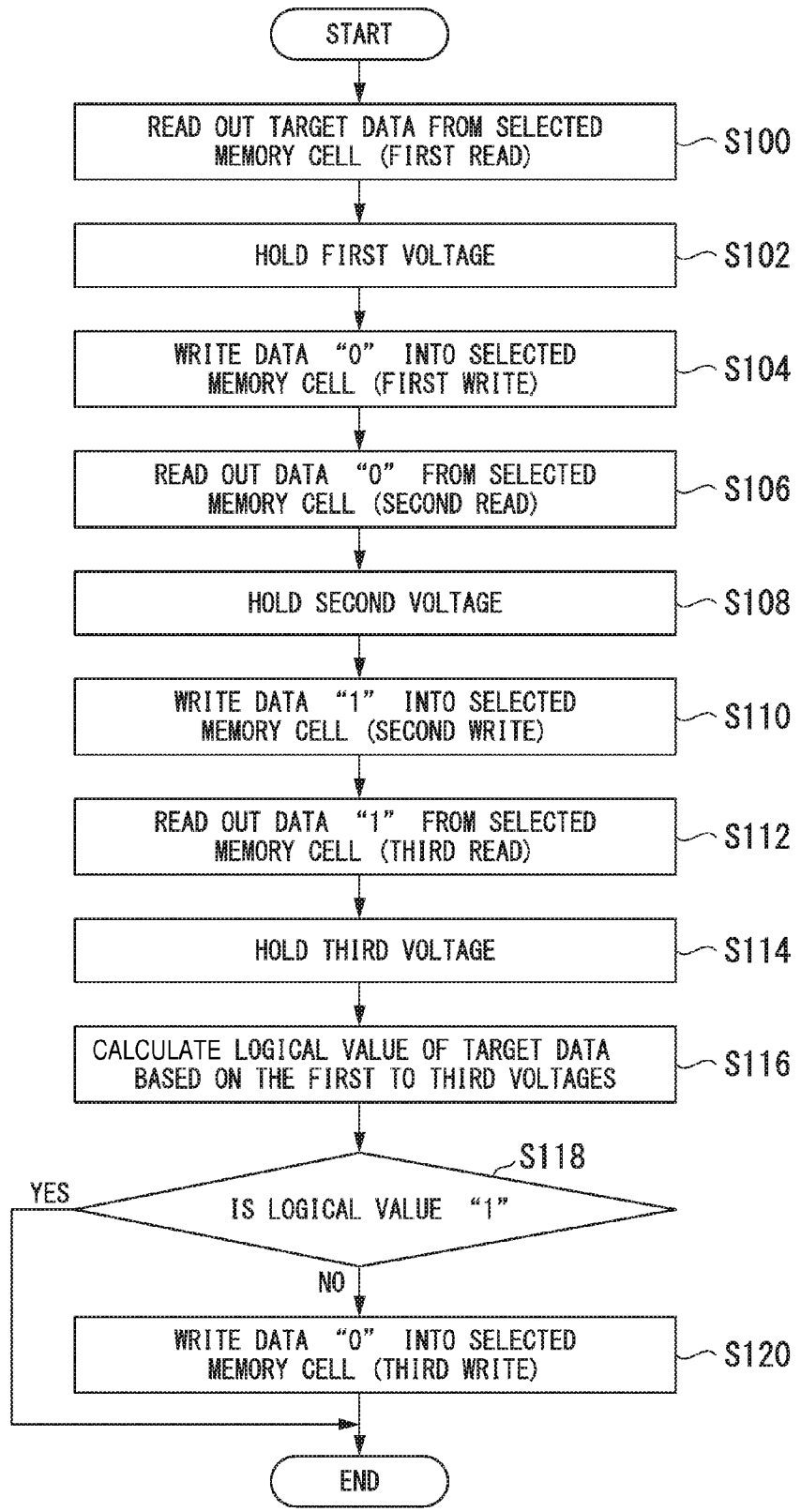
FIG. 8 is a flowchart showing an example of the flow of the data readout operation.
Figure 9:
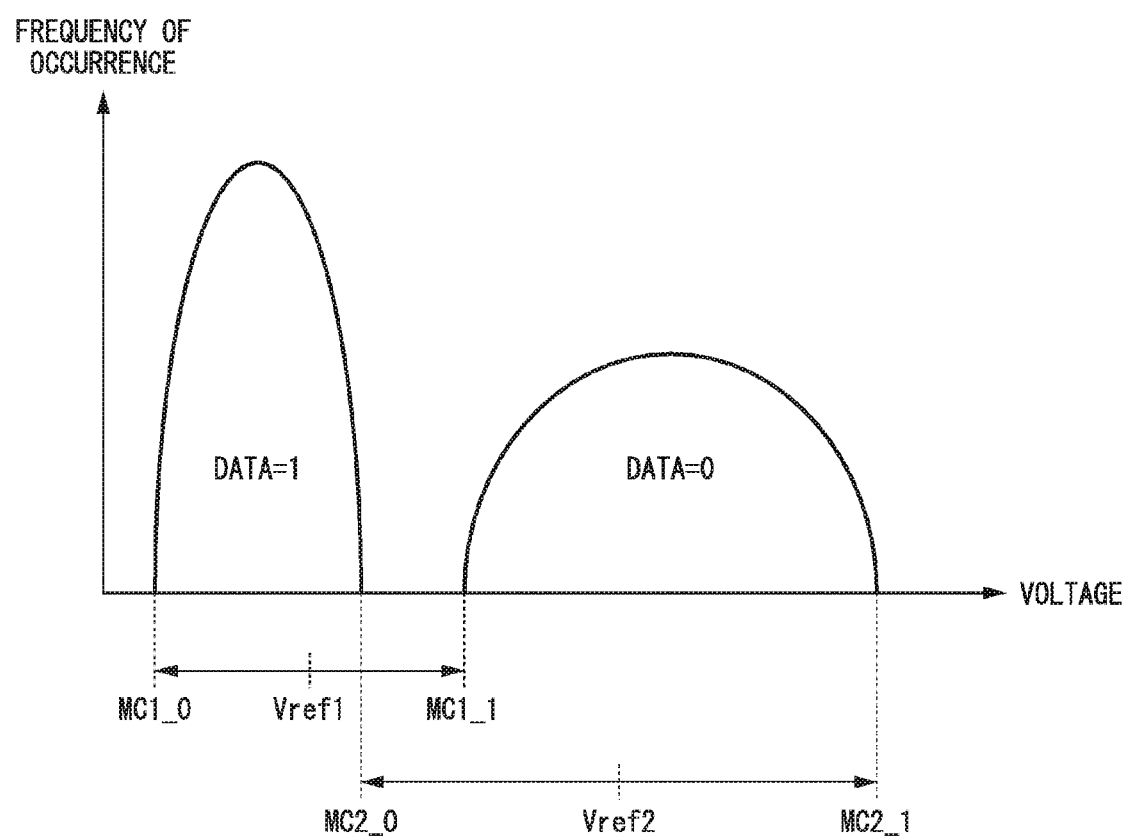
FIG. 9 shows a relationship between a memory cell voltage and a reference value.

FIG. 7 is a timing chart showing levels of the read current Ir and the write current Iw, and the output level of the sense amplifier 1162 during the data readout operation. FIG. 8 is a flowchart showing an example of the flow of the data readout operation. FIG. 9 illustrates a relationship between the voltage of a cell and the reference signal.

First, from time t0 to time t1, the read/write controller 1202 executes the first read processing of reading out the target data from the selected memory cell (S100). Next, the sense amplifier 1162 holds in the transistors 1162b and 1162c the voltage Vx as the detected voltage corresponding to the data recorded in the selected memory cell (S102).

Next, from time t1 to time t2, the read/write controller 1202 executes the first write processing of writing the reference data "0" in the selected memory cell (S104). At this time, the data that was recorded in the selected memory cell is overwritten with the data "0".

Next, from time t2 to time t3, the read/write controller 1202 executes the second read processing of reading out the data "0" from the selected memory cell (S106). Then, the sense amplifier 1162 holds, in the transistor 1162d, the voltage V0 as the reference voltage corresponding to the data "0" recorded in the selected memory cell (S108).

Next, from time t3 to time t4, the read/write controller 1202 executes the second write processing of writing the reference data "1" in the selected memory cell (S110). At this time, the data that was recorded in the selected memory cell is overwritten with the data "1".

Next, from the t4 to time t5, the read/write controller 1202 executes the third read processing of reading out the data "1" from the selected memory cell (S112). Then, the sense amplifier 1162 holds, in the transistor 1162e, the voltage V1 as the reference voltage corresponding to the data "1" recorded in the selected memory cell (S114).

Next, from time t5 to time t6, the read/write controller 1202 detects the logical value output by the sense amplifier 1162 (S116, the sense output in FIG. 7). At this time, the transistors 1162b and 1162c output to the latch circuit 1162a a signal corresponding to the detected voltage. The transistors 1162d and 1162e output to the latch circuit 1162a a signal of the intermediate value between the voltage corresponding to the data "0" and the voltage corresponding to the data "1".

The latch circuit 1162a compares the signal corresponding to the detected voltage input from the transistors 1162b and 1162c with the signal of the intermediate value input from the transistors 1162d and 1162e. The latch circuit 1162a amplifies the difference between the signal corresponding to the detected voltage and the signal of the intermediate value. The read/write controller 1202 detects the logical value of "0" or "1", based on the signal input from the latch circuit 1162a.

As shown in FIG. 9, if the data "0" is recorded in the selected memory cell (1), the voltage MC1_0 is detected, and if the data "1" is recorded in the selected memory cell (1), the voltage MC1_1 is detected. In this case, a voltage of an intermediate value between the voltage MC1_0 and the voltage MC1_1 is input to the latch circuit 1162a as the reference value Vref1. The latch circuit 1162a compares the signal value (first signal) input from the transistors 1162b and 1162c with the reference value Vref1 (second signal). If the signal value (first signal) is larger than the reference value Vref1 (second signal), the latch circuit 1162a outputs data "1". If the signal value (first signal) is smaller than the reference value Vref1 (second signal), the latch circuit 1162a outputs data "0".

If the data "0" is recorded in the selected memory cell (2), the voltage MC2_0 is detected, and if the data "1" is recorded in the selected memory cell (2), the voltage MC2_1 is detected. In this case, a voltage that is an intermediate value between the voltage MC2_0 and the voltage MC2_1 is input to the latch circuit 1162a as the reference value Vref2. The latch circuit 1162a compares the signal value (first signal) input from the transistors 1162b and 1162c with the reference value Vref2 (second signal). If the signal value (first signal) is larger than the reference value Vref2 (second signal), the latch circuit 1162a outputs data "1". If the signal value (first signal) is smaller than the reference value Vref2 (second signal), the latch circuit 1162a outputs data "0".

In this manner, the latch circuit 1162a can output a logical value with high accuracy by generating different reference values (second signal) for each selected memory cell.

Next, the read/write controller 1202 determines whether or not the logical value is "1" (S118). If it is determined that the logical value is "1" (Yes in S118), the read/write controller 1202 ends the data readout operation, in which case the read/write controller 1202 does not supply to the selected memory cell the write current Iw during third write processing during the time from t6 to t7, as indicated by the dotted line in the third write processing shown in FIG. 7.

If it is determined that the logical value is not "1" (No in S118), the read/write controller 1202 executes the third write processing to write the data "0" into the selected memory cell (S120). That is, the read/write controller 1202 writes into the selected memory cell the same data that was read out during the first readout processing. In this case, the read/write controller 1202 supplies to the selected memory cell the write current Iw during the third write processing, as indicated by the solid line in the third write processing shown in FIG. 7.

During the above-described data readout operation of the present embodiment, the data readout operation may be ended if the logical value is "1" and the data "0" may be written into the selected memory cell if the logical value is not "1". However, the data readout operation is not limited thereto. For example, during the above-described data readout operation, if the data "0" was written during the second write processing, the data readout operation may be ended if the logical value is "0", and the data "1" may be written into the selected memory cell if the logical value is not "0".

Additionally, the data readout operation, as described above, may write both "1" and "0" as the reference data, but the values are not limited thereto. The data readout operation may be performed to write one of "1" and "0" as the reference data, and the logical value may be determined based on the relationship between a reference voltage that is based on the reference data that was written and the voltage detected during the first read processing.

The following describes power supply via the second terminals 132 and 134 when power supplied to the memory cell unit 110 and the controller 120 via the connector 140 is shut off.

Figure 10:
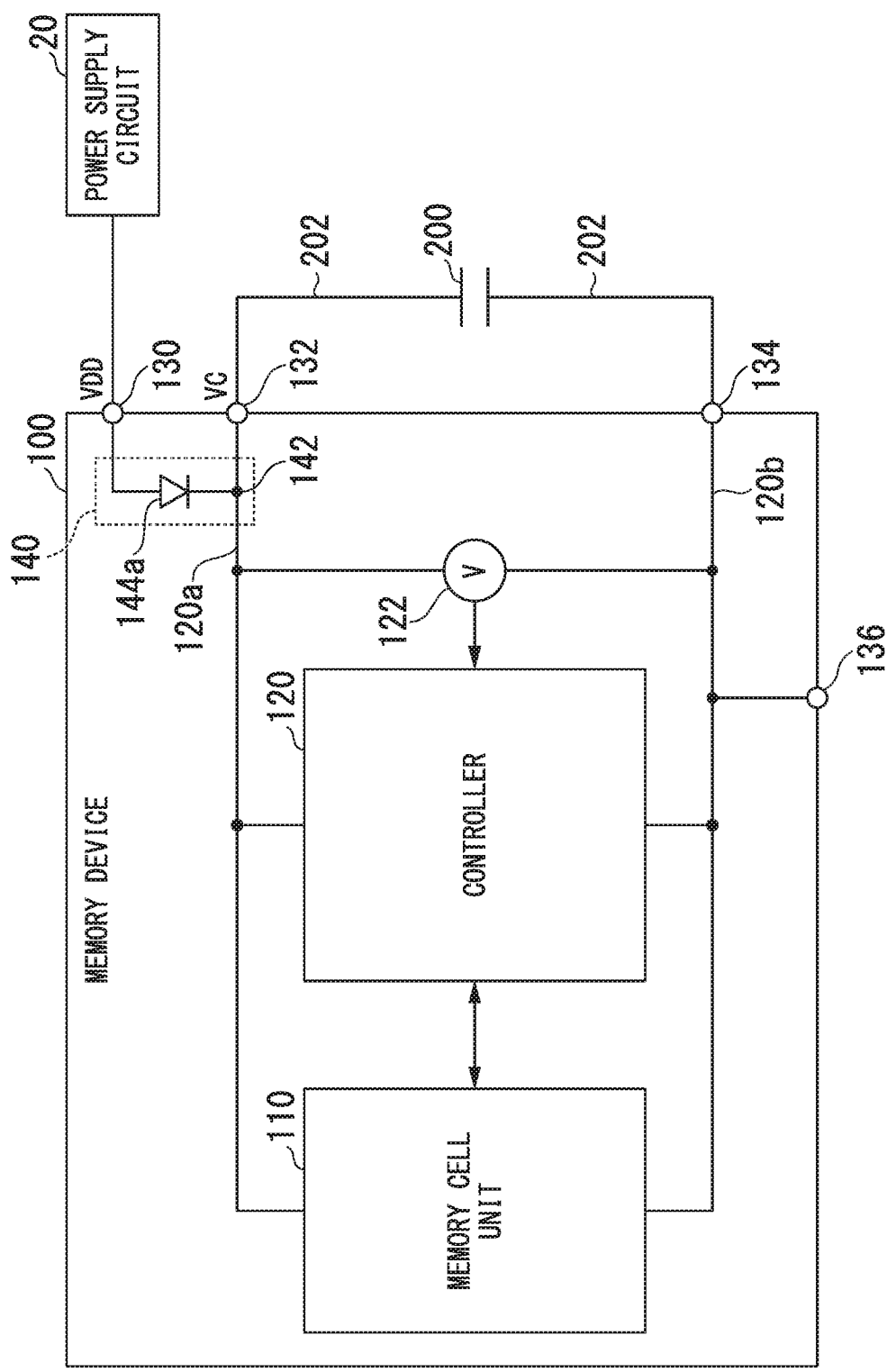
FIG. 10 shows another example of the memory device in the memory system.

FIG. 10 shows an example of the memory device 100. In the memory device 100, the controller 120 is connected to a positive electrode line 120a and a negative electrode line 120b. The controller 120 is connected to the first terminal 130 via the positive electrode line 120a. The negative electrode line 120b is connected to the ground terminal 136. As a result, the operating voltage VDD is applied to the controller 120.

The first terminal 130 and the second terminal 132 are connected to the brancher 142 of the connector 140. Although the brancher 142 is provided at the positive electrode line 120a, the location thereof is not limited thereto. That is, the brancher 142 is connected to any line that is connected to both the first terminal 130 and the second terminal 132.

A diode 144a is connected to the line between the first terminal 130 and the brancher 142. The diode 144a is an example of the circuit 144. The cathode of the diode 144a is connected to the first terminal 130, and the anode of the diode 144a is connected to the brancher 142.

The second terminal 132 is connected to the controller 120 and the memory cell unit 110 via the brancher 142 of the connector 140. The second terminal 134 is connected to the negative electrode line 120b. As a result, power stored in the capacitor 200 is supplied to the controller 120 and the memory cell unit 110. Also, the capacitor voltage VC is applied to the memory cell unit 110 and the controller 120.

The voltage detector 122 is connected to the positive electrode line 120a and the negative electrode line 120b. The voltage detector 122 detects the voltage of the power supplied to the memory cell unit 110 and the controller 120. The voltage detected by the voltage detector 122 is read by the controller 120.

The capacitor 200 is connected to the memory device 100 via the second terminals 132 and 134 and the interconnect 202. If the application of the operating voltage VDD has started, the capacitor 200 is charged by the power supplied to the second terminals 132 and 134 via the first terminal 130. If the operating voltage VDD drops, the capacitor 200 discharges charged energy. Thus, by supplying the charged energy to the memory cell unit 110 and the controller 120, the capacitor voltage VC is applied to the memory cell unit 110 and the controller 120. The capacitance of the capacitor 200 is set so that power required for the data readout operation can be stored. The power required for the data readout operation is power required for completion of the data readout operation described above.

If the first power is supplied to the first terminal 130, the operating voltage VDD is applied between the positive electrode line 120a and the negative electrode line 120b. The controller 120, in response to a command transmitted from the main controller 14, drives the memory cell unit 110. The operating voltage VDD is the same as or greater than the capacitor voltage VC. The capacitor voltage VC is higher than the minimum limit of the voltage required to operate the memory cell unit 110 and the controller 120.

In the memory device 100, if the operating voltage VDD drops to lower than the capacitor voltage VC, energy is discharged and supplied from the capacitor 200 to the memory cell unit 110 and the controller 120. That is, the capacitor voltage VC is supplied to the memory cell unit 110 and the controller 120 from the capacitor 200. As a result, power is supplied from the capacitor 200 is supplied to the memory cell unit 110 and the controller 120.

Figure 11:
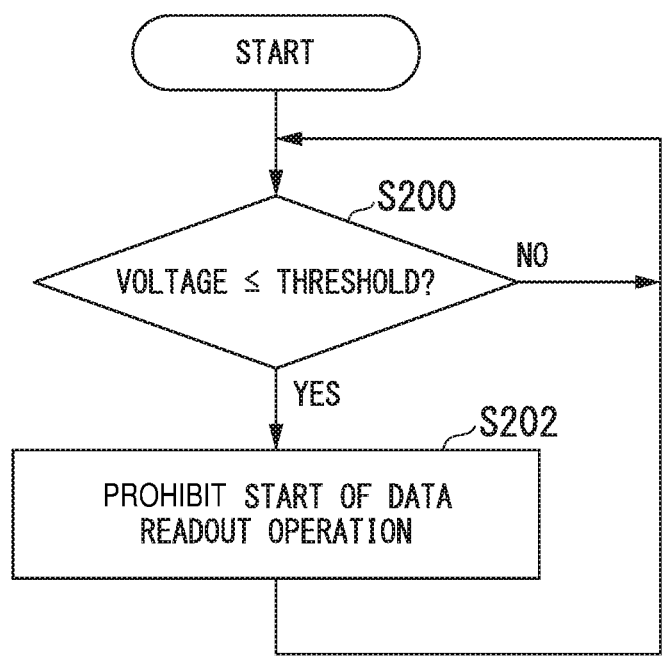
FIG. 11 is a flowchart showing an example of an operation procedure of a controller of the memory device.

FIG. 11 is a flowchart showing an example of the operation procedure of the controller. The processing shown in FIG. 11 is executed every prescribed time during operation of the controller 120. The processing shown in FIG. 11 is executed in parallel with the processing shown in FIG. 8.

First, the operation controller 1201 determines whether or not the voltage detected by the voltage detector 122 is equal to or less than a threshold (S200). The threshold is a value lower than the operating voltage VDD and higher than the minimum limit of the voltage required to operate the memory cell unit 110 and the controller 120. The threshold may be set to a further higher value to establish a sufficient period of time for operating the peripheral circuits of the controller 120, such as the memory cell unit 110, in order to complete the data readout operation.

The operation controller 1201 waits if it is determined that the voltage detected by the voltage detector 122 exceeds the threshold. If it is determined that the voltage detected by the voltage detector 122 drops to the threshold or lower, the operation controller 1201 prohibits start of the data readout operation (S202). That is, if the read command is received after the determination made at S200 that the voltage detected by the voltage detector 122 is equal to or less than the threshold, the operation controller 1201 does not cause the data readout operation to start. That is, if it is determined that the voltage detected by the voltage detector 122 is equal to or less than the threshold, the operation controller 1201 does not perform a data readout operation even if a data readout operation request is received.

If a determination is made that the voltage detected by the voltage detector 122 is equal to or less than the threshold and the data readout operation has already been started, the read/write controller 1202 uses power supplied to the memory device 100 from the capacitor 200 to complete the data readout operation.

The controller 120 does not start the data readout operation at S202 as described above. In addition, whether or not a command received from the main controller 14 is a read command may be determined. Only if the received command is a read command, the controller 120 may cause the data readout operation to not start.

Figure 12:
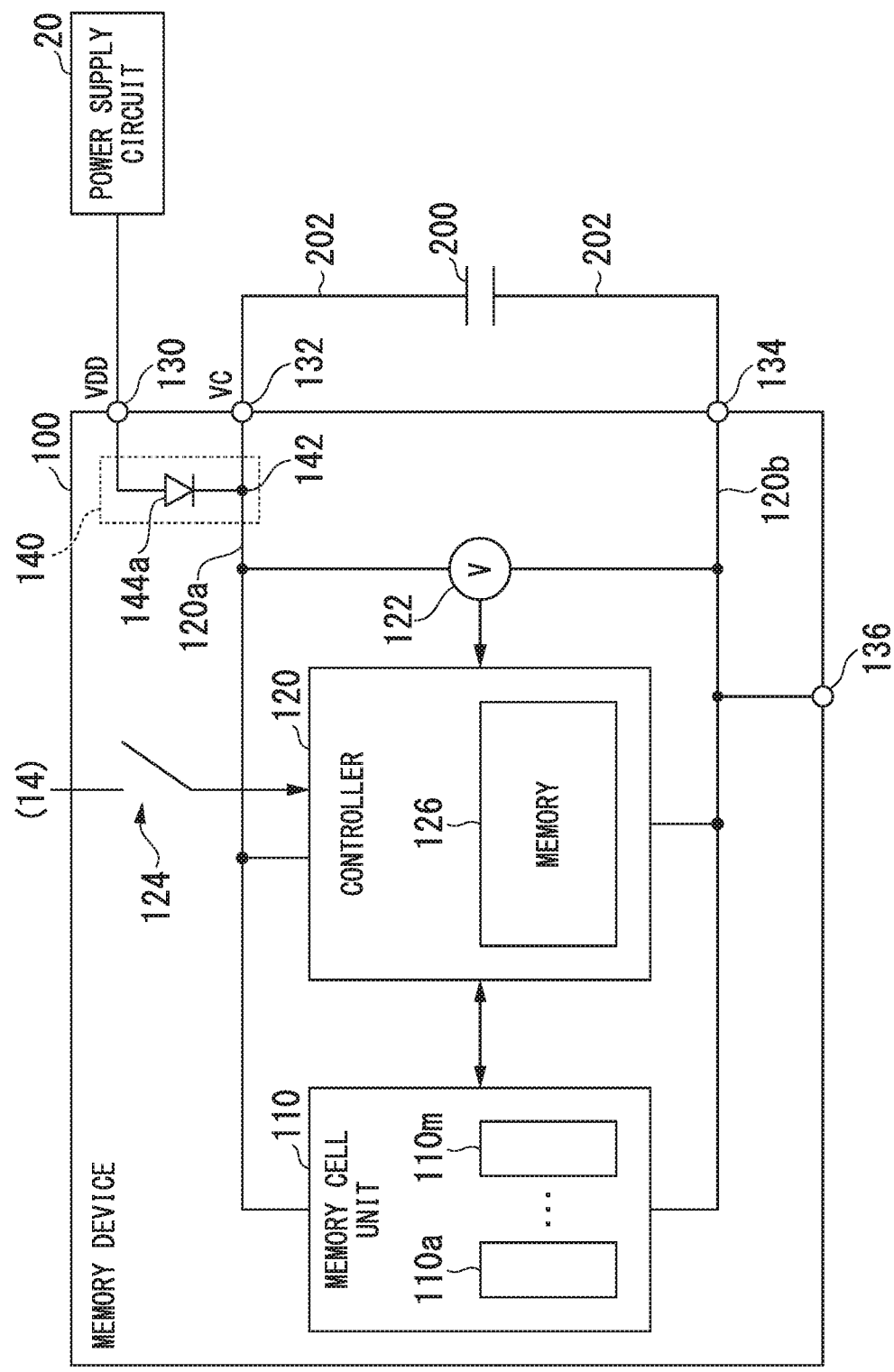
FIG. 12 shows another example of the memory device in the memory system.

The controller 120 may cut off a signal representing a command. That is, the controller 120 may cut off a signal line that connects the main controller 14 and the controller 120. The signal line connecting the main controller 14 and the controller 120 is a signal line that transfers a signal representing a command to the controller 120. The memory device 100, as shown in FIG. 12, has a third switch 124 provided in the signal line. By setting the third switch 124 to off, the controller 120 blocks a signal representing a command. FIG. 12 shows another example of a memory device of the embodiment.

Additionally, the controller 120 may start a data readout operation with respect to a memory cell 1120 that is different from the memory cell 1120 corresponding to the logical address specified by the read command. The memory cell unit 110 includes, as shown in FIG. 12, a plurality of physical blocks 110a, ..., 110m, where m is an arbitrary natural number. In this case, the read/write controller 1202 rewrites the address of the memory cell 1120 specified by a read command to the address of a memory cell 1120 that is different from that of the specified memory cell 1120. The read/write controller 1202 causes a data readout operation with respect to the rewritten address of the memory cell 1120. By doing this, the read/write controller 1202, for example, performs a data readout operation with respect to the physical block 110m instead of the physical block 110a. Although the memory cell 1120 that is different from the memory cell 1120 specified by the read command may be a memory cell 1120 in which data is not stored, the type of the memory cell is not limited thereto. For example, the different memory cell 1120 may be a memory cell that is less likely to lose data by reading thereof.

If the voltage detected by the voltage detector 122 is equal to or less than a threshold, the read/write controller 1202 may store the read command into the memory cell unit 110 or into a memory 126 that is different from the memory cell unit 110. In the state in which a read command is stored in the memory cell unit 110 or the memory 126, if the voltage detected by the voltage detector 122 exceeds the threshold, the read/write controller 1202 may start a data readout operation based on the read command stored in the memory cell unit 110 or the memory 126.

Although the above-described memory device 100 performs read processing based on a command received from the host 30, the manner of performing the read processing is not limited thereto. If the memory device 100 performs a data readout operation based on a read command internally generated by the main controller 14, the capacitor voltage VC may be used to complete the data readout operation. Data readout operations based on an internally generated read command include processing to form free blocks within the NAND chip 18, refreshing, and data readout operations related to refresh and garbage collection.

As described above, in the memory system 10 of the first embodiment, because the capacitor 200 is connected to the memory device 100, if the power supplied via the connector 140 is cut off, power supplied via the second terminals 132 and 134 is supplied to memory cell unit 110 and the controller 120. Thus, according to the memory device 100 of the first embodiment, power supplied via the capacitor 200 can be used to continue the data readout operation.

In this case, the capacitor 200 is not connected to a plurality of second power sources, which are the power supply sources of the power supply circuit 20 outside of the memory device 100, each supplying power to a corresponding one of the memory devices 100. This enables the prompt application of the capacitor voltage VC to the memory cell unit 110 and the controller 120 by the capacitor 200 if the operating voltage VDD drops. As a result, the memory system 10 can avoid the stoppage of operation of the memory cell unit 110 and the controller 120 caused by a drop of the operating voltage VDD before completion of a data readout operation. As a result, the memory device 100 can assure data protection.

The memory device 100 of the first embodiment may have a voltage-boosting circuit. A voltage-boosting circuit boosts the capacitor voltage VC to the operating voltage VDD. In the memory device 100, this enables the reliably continued operation of the memory cell unit 110 and the controller 120 if then the operating voltage VDD has dropped.

The memory device 100 of the first embodiment has a diode 144a provided in a line that connects the first terminal 130 and the brancher 142. According to the memory device 100 of the first embodiment, it is possible to suppress current flowing from the capacitor 200 to the first terminal 130 if the operating voltage VDD drops. As a result, it is possible to supply to the memory cell unit 110 and the controller 120 power supplied to the memory device 100 from the capacitor 200, thereby further improving reliability of data protection.

Additionally, according to the memory device 100 of the first embodiment, if the operating voltage VDD drops, because a data readout operation is not started even if a read command is received, the loss of data by the start of a new data readout operation can be prevented.

Second Embodiment

Figure 13:
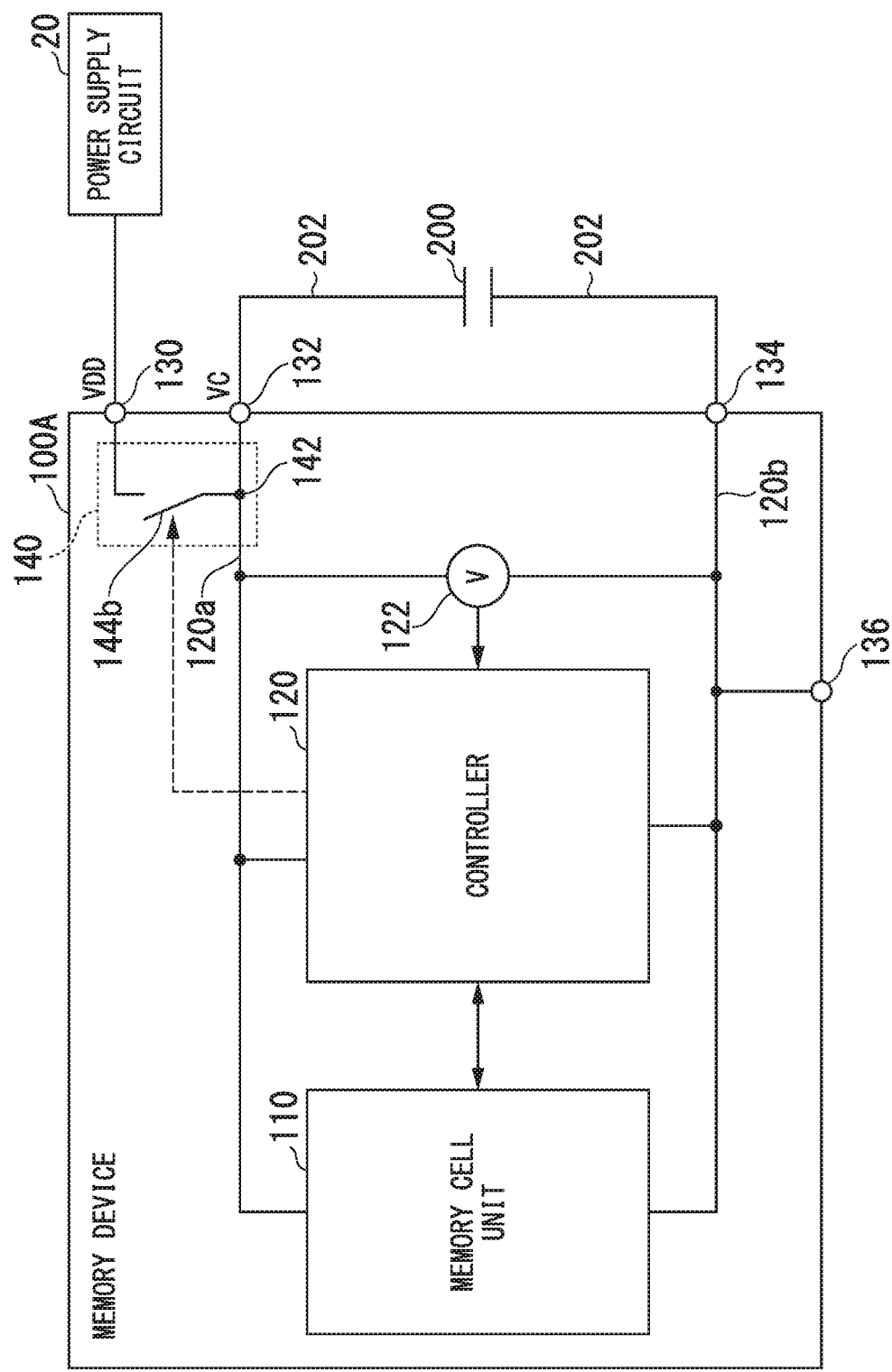
FIG. 13 is a circuit diagram of a memory device according to a second embodiment.

A memory device according to a second embodiment will be described below. FIG. 13 shows an example of a memory device 100A according to the second embodiment. The memory device 100A includes a first switch 144b in place of the diode 144a. The first switch 144b is an example of the circuit 144. Although the first switch 144b may be a mechanical switch, the type of the first switch 144a is not limited thereto. For example, the first switch 144b may be a semiconductor switch. The first switch 144b is provided in a line that connects the first terminal 130 and the brancher 142. The first switch 144b switches the current flowing in the line connecting the first terminal 130 and the brancher 142 between the non-conduction state and the conduction state. The controller 120 outputs to the first switch 144b a control signal that switches the state of the first switch 144b between on and non-conduction states.

Figure 14:
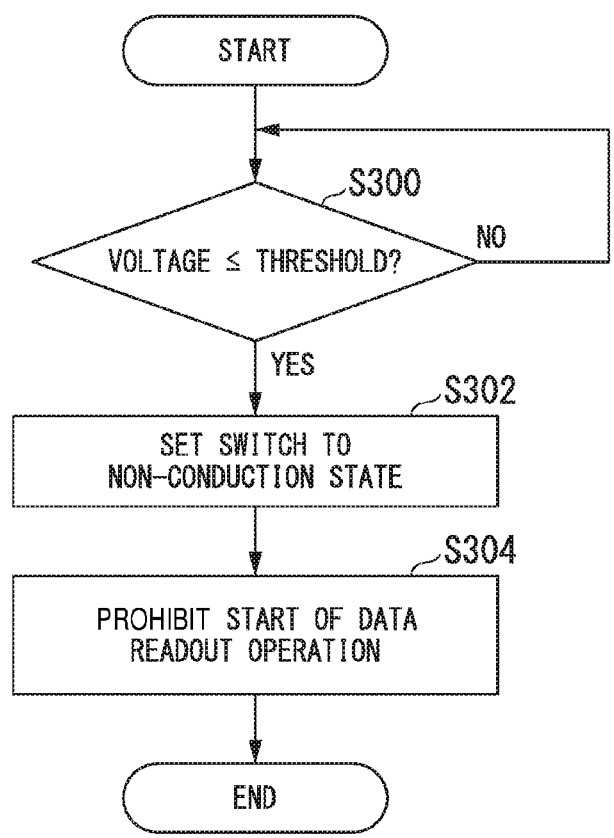
FIG. 14 is a flowchart showing an example of the flow of an operation carried out by a controller according to a second embodiment.
Figure 15:
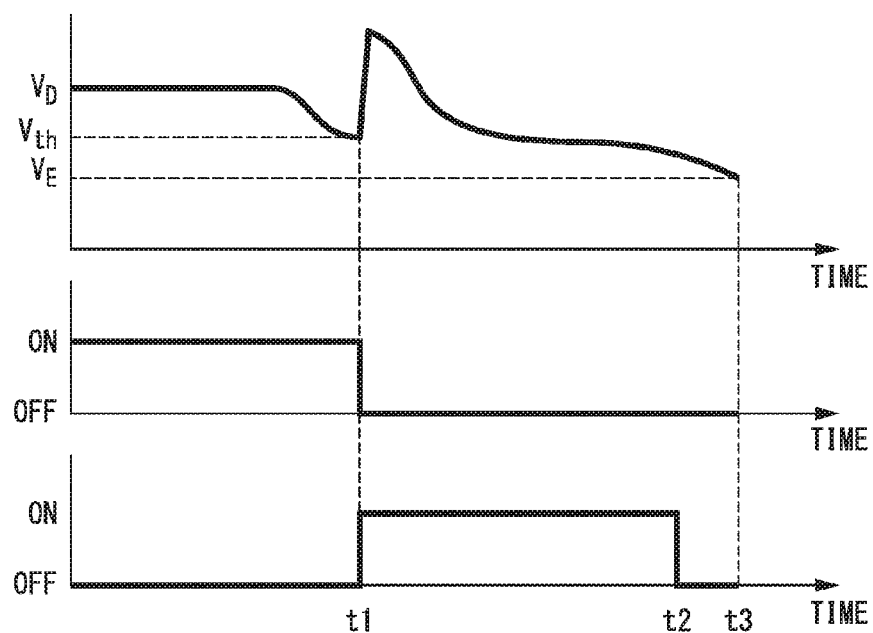
FIG. 15 shows a relationship between voltage applied to the memory cell unit and the controller, the switch state, and starting and completion of a data readout operation according to a second embodiment.

FIG. 14 is a flowchart showing an example of the flow of the operation carried out by the controller 120. The processing shown in FIG. 14 is executed every prescribed time during operation of the controller 120. FIG. 15 shows an example of the relationship between the voltage applied to the memory cell unit and the controller 120, the first switch state, and the starting and completion of a data readout operation.

First, the operation controller 1201 determines whether or not the voltage detected by the voltage detector 122 is equal to or less than a threshold (S300). The operation controller 1201, as shown at the top graph of FIG. 15, determines that the voltage detected by the voltage detector 122 exceeds the threshold $V_{TH}$ if the operating voltage VDD is applied to the memory cell unit 110 and the controller 120. In this case, the operation controller 1201 waits. The operation controller 1201, as shown in the middle graph of FIG. 15, maintains the state of the first switch 144b as on.

As shown in the top graph of FIG. 15, if the operating voltage VDD has dropped below the threshold $V_{TH}$, the operation controller 1201 determines that the voltage detected by the voltage detector 122 is equal to or less than the threshold (time t1). In this case, the first switch 144b is switched to the open (non-conduction state) state (S302). As a result, the power supplied to the memory cell unit 110 and the controller 120 from the first terminal 130, via the brancher 142 is cut off.

Energy discharged from the capacitor 200 is supplied to the memory cell unit 110 and the controller 120. This continues the supply of a voltage to the memory cell unit 110 and the controller 120 that can drive the memory cell unit 110 and the controller 120. After that, the capacitor voltage VC gradually drops and, at time t3, reaches a lower limit value $V_E$ at which operation of the memory cell unit 110 and the controller 120 is possible. The capacitance of the capacitor 200 is set to enable application to the memory cell unit 110 and the controller 120 of a voltage that drives the memory cell unit 110 and the controller 120, at least from the start of the data readout operation (for example, time t1) until the completion of the data readout operation (for example t2). That is, the capacitance of the capacitor 200 may be set based on a value that is the product of the operating voltage of the memory cell unit 110 and the controller 120 and the period of time from the starting time (for example t1) of the data readout operation to the completion time (for example t2) of the data readout operation.

Next, the operation controller 1201 prohibits start of a data readout operation (S304). That is, if a read command is received after the voltage detected by the voltage detector 122 drops to the threshold or therebelow at S300, the operation controller 1201 does not start the data readout operation.

If a data readout operation is started at the time when the voltage detected by the voltage detector 122 is determined to be equal to or less than the threshold, the read/write controller 1202 writes into the memory cell 1120 into which data had been stored the data that was read out through the data readout operation.

As described above, in the memory device 100A according to the second embodiment, if the voltage detected by the voltage detector 122 is equal to or less than the threshold, by switching the first switch 144b to the non-conduction state, the capacitor voltage VC is applied to the memory cell unit 110 and the controller 120 from the capacitor 200. Thus, according to the memory device 100A, it is possible to avoid stopping of the operation of the memory cell unit 110 and the controller 120 before completion of a data readout operation. As a result, according to the memory device 100A, the reliability of data protection can be ensured.

Third Embodiment

Figure 16:
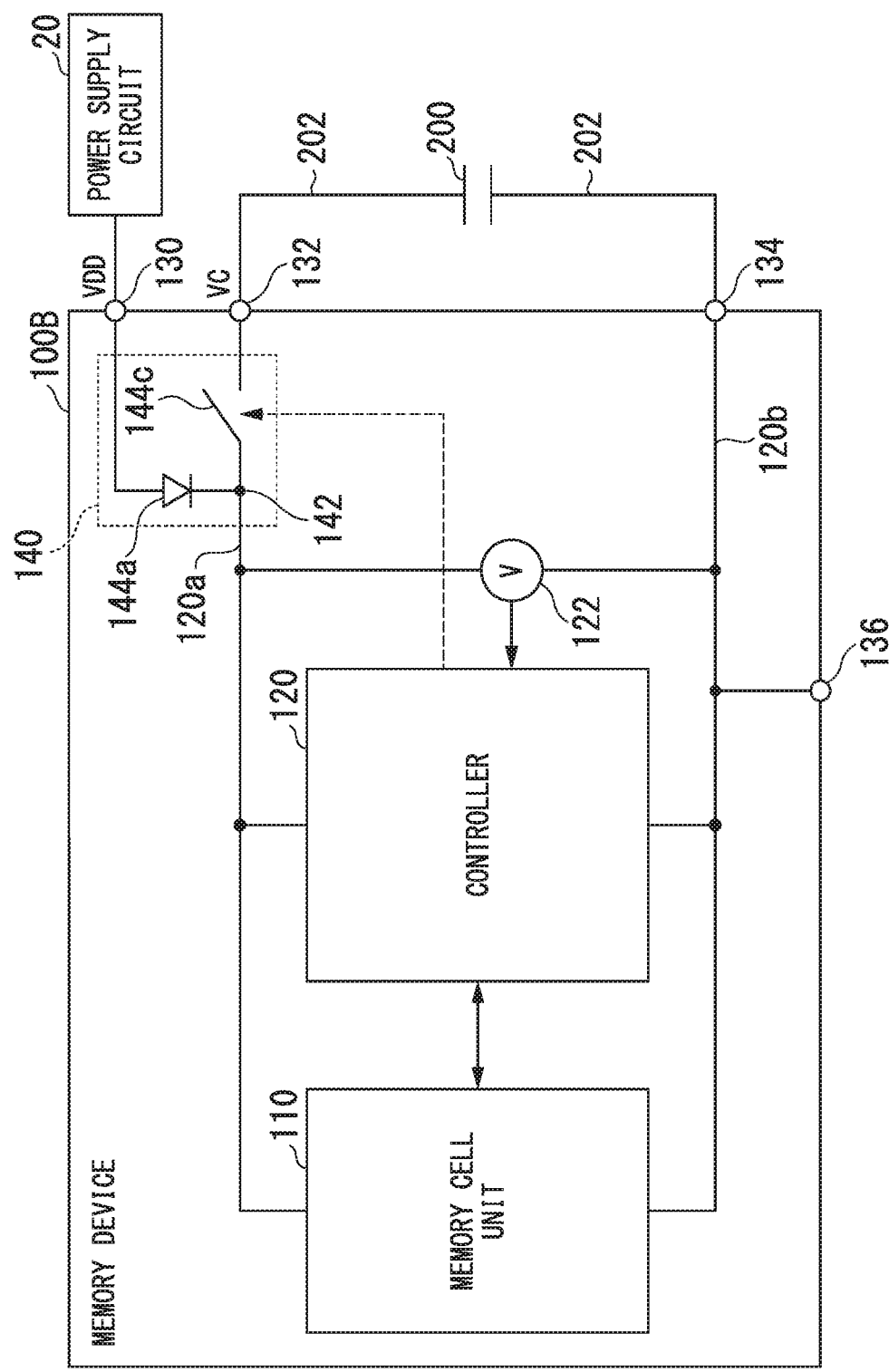
FIG. 16 is a circuit diagram of a memory device according to a third embodiment.

A memory device 100B according to a third embodiment will be described below. FIG. 16 shows the memory device 100B. The diode 144a of FIG. 16 may be replaced with the first switch 144b. The controller 120 includes a second switch 144c provided in a line connecting the second terminal 132 and the brancher 142. Although the second switch 144c may be a mechanical switch, the type of the second switch 144c is not limited thereto. The second switch 144c may be a semiconductor switch.

The second switch 144c switches the current flowing in the line connecting the second terminal 132 and the brancher 142 between the conduction state and the non-conduction state. The controller 120 outputs to the second switch 144c a control signal that switches the state of the second switch 144c between conduction state and non-conduction state.

In the case in which power supply from the power supply circuit 20 to the memory device 100B has started, if the capacitor 200 is not charged, the controller 120 controls the conducting state of the second switch 144c. By doing this, the second switch 144c supplies the power supplied to the first terminal 130 to the capacitor 200 via the first terminal 130 and the brancher 142. If the capacitor 200 has been charged sufficiently, the power supplied from the first terminal 130 to the connector 140 is supplied to the memory cell unit 110 and the controller 120. This starts the operation of the memory cell unit 110 and the controller 120. In this case, the voltage detected by the voltage detector 122 exceeds the threshold. If the capacitor 200 has been charged with energy, the controller 120 performs control to place the second switch 144c in the non-conduction state.

If the voltage detected by the voltage detector 122 exceeds the threshold, the operation controller 1201 maintains the second switch 144c in the non-conduction state. By doing this, the controller 120 avoids the flow of current from the capacitor 200 into the first terminal 130.

If the voltage detected by the voltage detector 122 is equal to or less than the threshold, the operation controller 1201 switches the state of the second switch 144c from the non-conduction state to the conduction state. By doing this, if the operating voltage VDD has dropped below the capacitor voltage VC, the discharged energy from the capacitor 200 is supplied to the cell memory unit 110 and the controller 120.

As described above, the memory device 100B of the third embodiment switches the second switch 144c to the conduction state, thereby applying the capacitor voltage VC to the memory cell unit 110 and the controller 120, if the voltage detected by the voltage detector 122 is equal to or less than the threshold. By doing this, according to the memory device 100B, it is possible to avoid a stoppage of operation of the memory cell unit 110 and the controller 120 before completion of a data readout operation. As a result, according to the memory device 100B, the reliability of data protection can be ensured.

Fourth Embodiment

Figure 17:
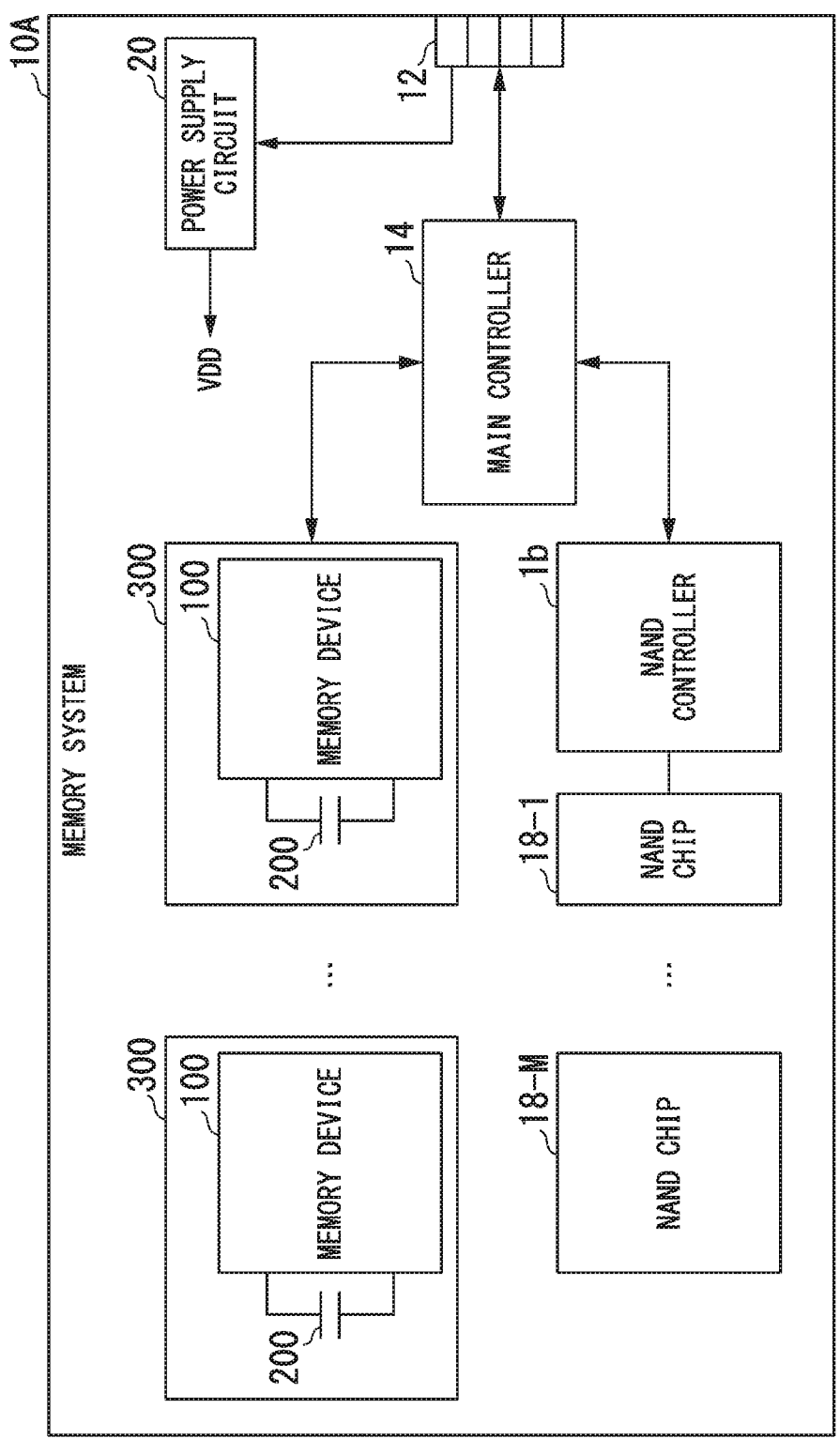
FIG. 17 shows an example of a memory system according to a fourth embodiment.

A memory system 10A according to a fourth embodiment will be described below. FIG. 17 shows the memory system 10A according to the fourth embodiment. The memory system 10A according to the fourth embodiment includes a plurality of packages 300 each of which includes a memory device 100 and a capacitor 200. Because the configuration of each package 300 other than the integration of the memory device 100 and the capacitor 200 is the same as the above-described embodiments, the description thereof will be omitted.

When mounting the package 300 in the memory system 10A, the memory device 100 and the capacitor 200 can be mounted to a board of the memory system 10A through a single operation. According to the memory system 10A, in order to avoid read data from being lost during mounting of the memory device 100, it is possible to make the task of connecting the memory device 100 to the capacitor 200 unnecessary.

At least one of the above-described embodiments includes a memory device 100, a power supply circuit 20 supplying power to the memory device 100, and a capacitor 200 that supplies power to the memory device 100 and that is not connected to the source of power supply of the power supply circuit 20 outside the memory device 100 (for example, the power supply circuit 30a of the host 30). In at least one embodiment, the memory device 100 has a first terminal 130 supplied with power from the power supply circuit 20, second terminals 132 and 134 connected to the power supply circuit 20 and supplied with power from a capacitor 200, a connector 140 connecting between the first terminal 130, the second terminals 132 and 134, a memory cell unit 110, and a controller 120, a memory cell unit 110 that includes a plurality of cells 1120, the states of each cell 1120 being switched by the controller 120 between a first state and a second state that is different from the first state, and the controller 120 that controls the writing and the readout of data of the memory cell unit 110 and that performs a first processing that includes a first read processing that reads out a first data from a first cell of the plurality of cells 1120, a first write processing that writes reference data into the first cell, a second read processing that reads out the reference data that was written into the first cell, and a second write processing that, based on the relationship between the first data and the reference data, writes into the first cell data that is the same as the first data that was read out from the first cell by the first read processing. In at least one embodiment, if the supply of power that is supplied via the connector 140 to the memory cell unit 110 and the controller 120 is cut off, power supplied via the second terminals 132 and 134 is supplied thereto. By doing this, according to at least one embodiment, if the power supplied to the first terminal 130 drops, the power supplied from the second terminals 132 and 134 is supplied to the memory cell unit 110 and the controller 120, thereby enabling continuous operation of the memory cell unit 110 and the controller 120. As a result, according to at least one embodiment, it is possible to avoid a stoppage of operation of the memory cell unit 110 and the controller 120 before completion of a data readout operation (first processing), thereby ensuring reliability of data protection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A storage device comprising:
a memory cell array including a plurality of memory cells, each of the memory cells including a magnetic tunnel junction having a first ferromagnetic layer in which a direction of magnetization is fixed, a second ferromagnetic layer in which a direction of magnetization is variable, and an insulating layer sandwiched between the first and second ferromagnetic layers;
a voltage detector disposed to detect a voltage of power supplied to the memory cell array; and
a controller configured to
carry out reading of data from a target memory cell, which is one of the memory cells, and then rewriting of the data in the target memory cell, if the detected voltage is above a threshold when a prompt of a read operation with respect to the target memory cell occurs, and
prohibit the reading operation from being started, if the detected voltage is below the threshold when the prompt occurs.

2. The storage device according to claim 1, wherein the prompt occurs responsive to a read command received from an external device.

3. The storage device according to claim 2, wherein the controller is further configured to cut off a signal line through which the read command is received, when the voltage detected by the voltage detector drops below the threshold.

4. The storage device according to claim 1, wherein the prompt occurs responsive to an internal determination by the controller.

5. The storage device according to claim 1, wherein the controller is further configured to carry out a reading operation with respect to a memory cell different from the target memory cell, if the detected voltage is below the threshold when the prompt occurs.

6. The storage device according to claim 1, wherein the controller is further configured to carry out saving of the prompt in a memory if the detected voltage is below the threshold when the prompt occurs, and carry out the read operation after the voltage detected by the voltage detector becomes above the threshold.

7. The storage device according to claim 1, wherein the controller operates using power supplied from a main power source when the detected voltage is above a second threshold, and using an auxiliary power source locally connected to the storage device when the detected voltage is below the second threshold.

8. The storage device according to claim 7, wherein the threshold is lower than the second threshold.

9. The storage device according to claim 7, wherein
the controller is further configured to disconnect a power supply line from the main power source, when the detected voltage is below the second threshold.

10. The storage device according to claim 7, wherein
the controller is further configured to connect a power supply line to the auxiliary power source, when the voltage detected by the voltage detector is below the second threshold.

11. The storage device according to claim 1, further comprising:
a diode disposed to allow a current to flow from the main power source to the auxiliary power source.

12. The storage device according to claim 1, wherein
during the read operation, with respect to the target memory cell, the controller reads stored data, overwrites a first value "0", reads the first value, overwrites a second value "1", reads the second value, and calculates a value of the stored data based on a value of the read stored data, the read first value, and the read second value.

13. A method for operating a storage device, comprising:
detecting a voltage of power supplied to a memory cell array of the storage device, the memory cell array including a plurality of memory cells, each of the memory cells including a magnetic tunnel junction having a first ferromagnetic layer in which a direction of magnetization is fixed, a second ferromagnetic layer in which a direction of magnetization is variable, and an insulating layer sandwiched between the first and second ferromagnetic layers;
if the detected voltage is above a threshold when a prompt of a read operation with respect to a target memory cell, which is one of the memory cells, occurs, carrying out reading of data from the target memory cell and then rewriting of the data in the target memory cell; and
if the detected voltage is below the threshold when the prompt occurs, prohibiting the read operation from being started.

14. The method according to claim 13, wherein
the prompt occurs responsive to a read command received from an external device.

15. The method according to claim 14, further comprising:
cutting off a signal line through which the read command is received, when the detected voltage is below the threshold.

16. The method according to claim 13, further comprising:
if the detected voltage is below the threshold when the prompt occurs, carrying out a reading operation with respect to a memory cell different from the target memory cell.

17. The method according to claim 13, further comprising:
operating the storage device using power supplied from a main power source, when the detected voltage is above a second threshold, and
operating the storage device using power supplied from an auxiliary power source locally connected to the storage device, when the detected voltage is below the second threshold.

18. The method according to claim 17, further comprising:
the threshold is lower than the second threshold.

* * * * *